(12) United States Patent
Motobayashi et al.

(10) Patent No.: US 10,824,060 B2
(45) Date of Patent: Nov. 3, 2020

(54) LIGHT SOURCE MODULE, METHOD OF MANUFACTURING LIGHT SOURCE MODULE, AND PROJECTION-TYPE DISPLAY UNIT

(71) Applicant: SONY CORPORATION, Tokyo (JP)

(72) Inventors: Hisayoshi Motobayashi, Kanagawa (JP); Tomoki Ono, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/321,556

(22) PCT Filed: Jun. 19, 2017

(86) PCT No.: PCT/JP2017/022516
§ 371 (c)(1),
(2) Date: Jan. 29, 2019

(87) PCT Pub. No.: WO2018/034055
PCT Pub. Date: Feb. 22, 2018

(65) Prior Publication Data
US 2019/0171091 A1 Jun. 6, 2019

(30) Foreign Application Priority Data
Aug. 19, 2016 (JP) .................. 2016-161143

(51) Int. Cl.
*G03B 21/16* (2006.01)
*G03B 21/20* (2006.01)
(Continued)

(52) U.S. Cl.
CPC ............. *G03B 21/16* (2013.01); *G02B 26/10* (2013.01); *G02B 27/0101* (2013.01);
(Continued)

(58) Field of Classification Search
CPC .......................... G03B 21/16; G03B 21/2013; G03B 21/2033; G03B 21/2066; G02B 26/10;
(Continued)

(56) References Cited

U.S. PATENT DOCUMENTS

2005/0190562 A1* 9/2005 Keuper .................. H04N 9/317
362/325
2012/0212929 A1* 8/2012 Li ........................ G03B 21/208
362/19
(Continued)

FOREIGN PATENT DOCUMENTS

CN 104221233 A 12/2014
CN 106415953 A 2/2017
(Continued)

OTHER PUBLICATIONS

International Search Report and Written Opinion of PCT Application No. PCT/JP2017/022516, dated Aug. 29, 2017, 11 pages of ISRWO.

*Primary Examiner* — Michelle M Iacoletti
*Assistant Examiner* — Magda Cruz
(74) *Attorney, Agent, or Firm* — Chip Law Group

(57) ABSTRACT

A light source module according to an embodiment of the present disclosure includes: a radiator; a plurality of light-emitting elements disposed on the radiator; a plurality of lenses that each convert a light beam outputted from corresponding one of the plurality of light-emitting elements into a collimated light beam and output the collimated light beam; a plurality of first optical elements that each reflect the collimated light beam outputted from corresponding one of the plurality of lenses while adjusting an optical axis direction of the collimated light beam; and a second optical element that multiplexes respective light beams reflected from the plurality of first optical elements.

18 Claims, 10 Drawing Sheets

(51) Int. Cl.
*G02B 26/10* (2006.01)
*G02B 27/01* (2006.01)
*G02B 27/10* (2006.01)
*H01S 5/022* (2006.01)
*H01S 5/024* (2006.01)
*H01S 5/40* (2006.01)
*H01S 5/00* (2006.01)

(52) U.S. Cl.
CPC ..... *G03B 21/2013* (2013.01); *G03B 21/2033* (2013.01); *H01S 5/022* (2013.01); *H01S 5/024* (2013.01); *H01S 5/02208* (2013.01); *H01S 5/02252* (2013.01); *H01S 5/4012* (2013.01); *G02B 27/01* (2013.01); *G02B 27/10* (2013.01); *G03B 21/2066* (2013.01); *H01S 5/005* (2013.01); *H01S 5/0071* (2013.01); *H01S 5/02272* (2013.01); *H01S 5/02469* (2013.01); *H01S 5/02476* (2013.01); *H01S 5/4093* (2013.01)

(58) Field of Classification Search
CPC .... G02B 27/0101; G02B 27/01; G02B 27/10; H01S 5/022; H01S 5/02208; H01S 5/02252; H01S 5/024; H01S 5/4012; H01S 5/005; H01S 5/0071; H01S 5/02272; H01S 5/02469; H01S 5/02476; H01S 5/4093

See application file for complete search history.

(56) References Cited

U.S. PATENT DOCUMENTS

| | | | |
|---|---|---|---|
| 2014/0198509 A1* | 7/2014 | Takiguchi | H01S 5/02 362/382 |
| 2015/0048147 A1 | 2/2015 | Ide et al. | |
| 2017/0207606 A1* | 7/2017 | Nakanishi | H01S 5/02248 |

FOREIGN PATENT DOCUMENTS

| | | |
|---|---|---|
| EP | 1569467 A2 | 8/2005 |
| JP | 61-013211 A | 1/1986 |
| JP | 61-13211 A | 1/1986 |
| JP | 04-006543 A | 1/1992 |
| JP | 04-6543 A | 1/1992 |
| JP | 2005-242364 A | 9/2005 |
| JP | 2016-015415 A | 1/2016 |
| TW | 200541109 A | 12/2005 |
| WO | 2013/146313 A1 | 10/2013 |
| WO | 2013/146749 A1 | 10/2013 |
| WO | 2016/002267 A1 | 1/2016 |

* cited by examiner

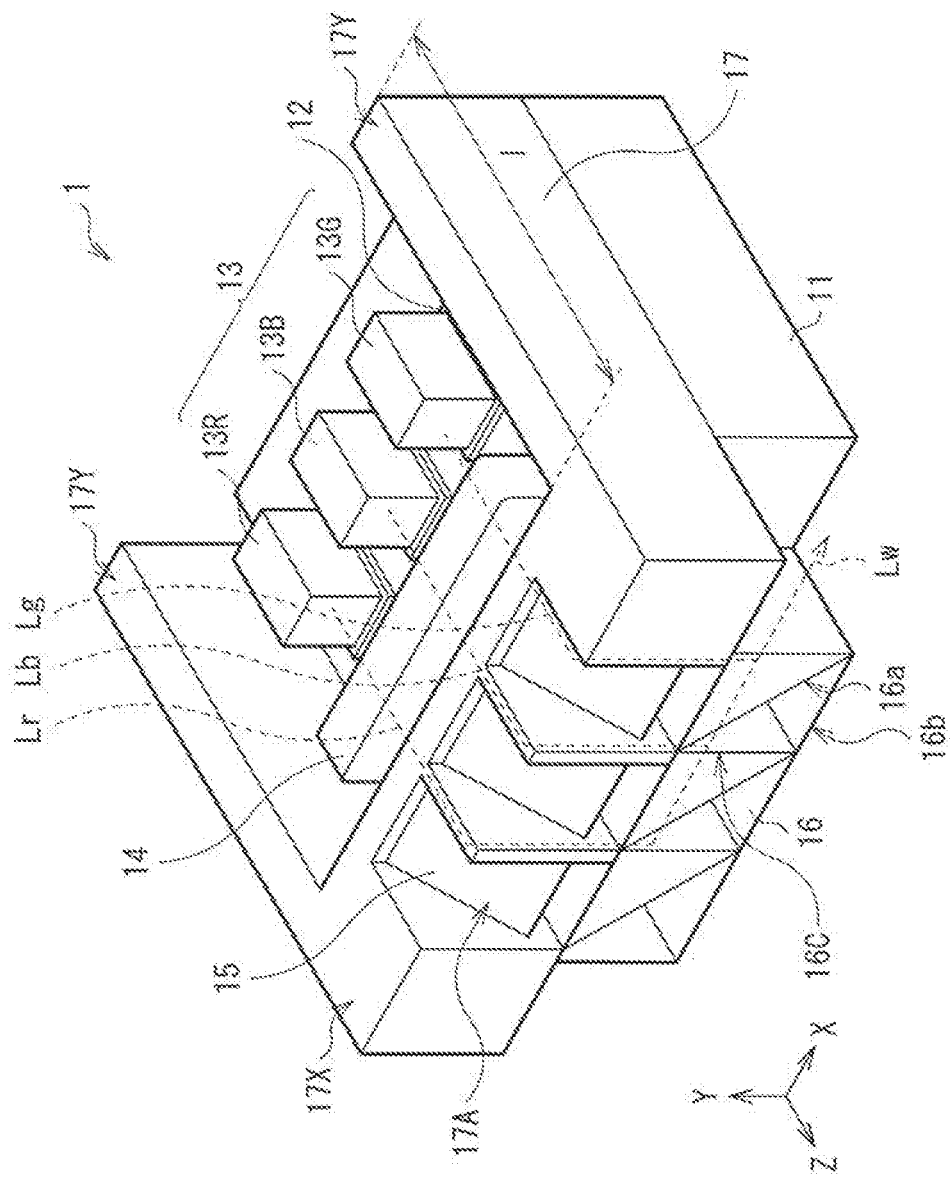
[FIG. 1]

[FIG. 2]
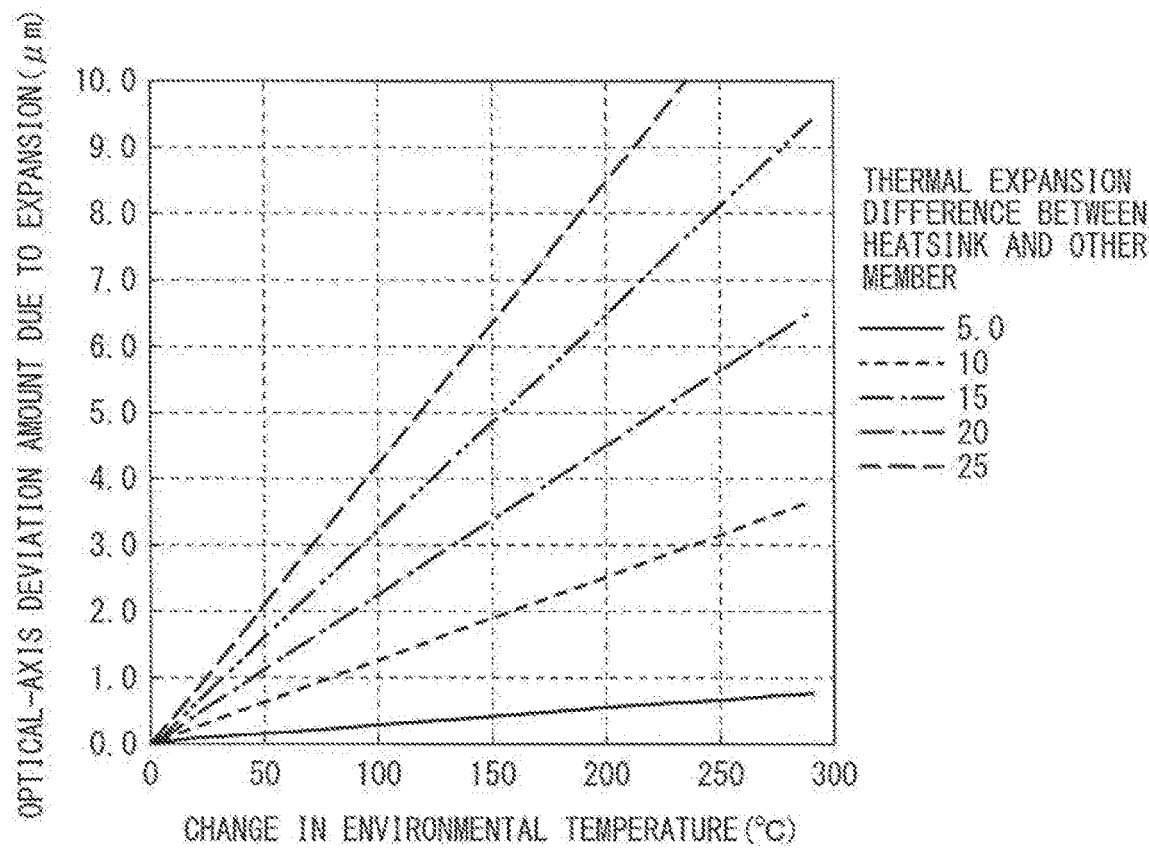
[FIG. 3]
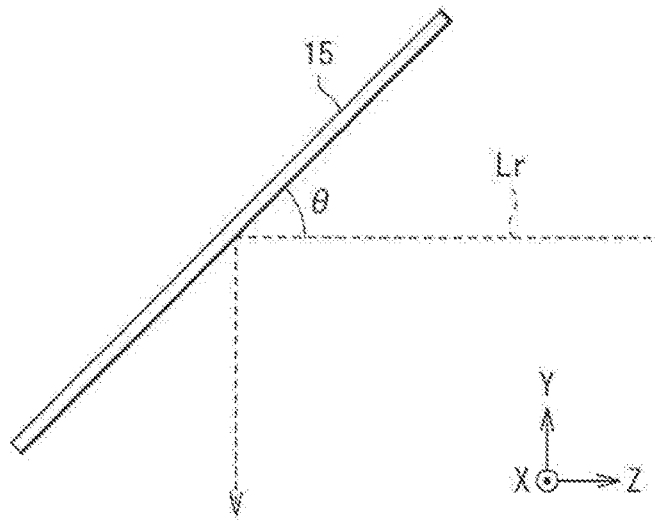

[FIG. 4]
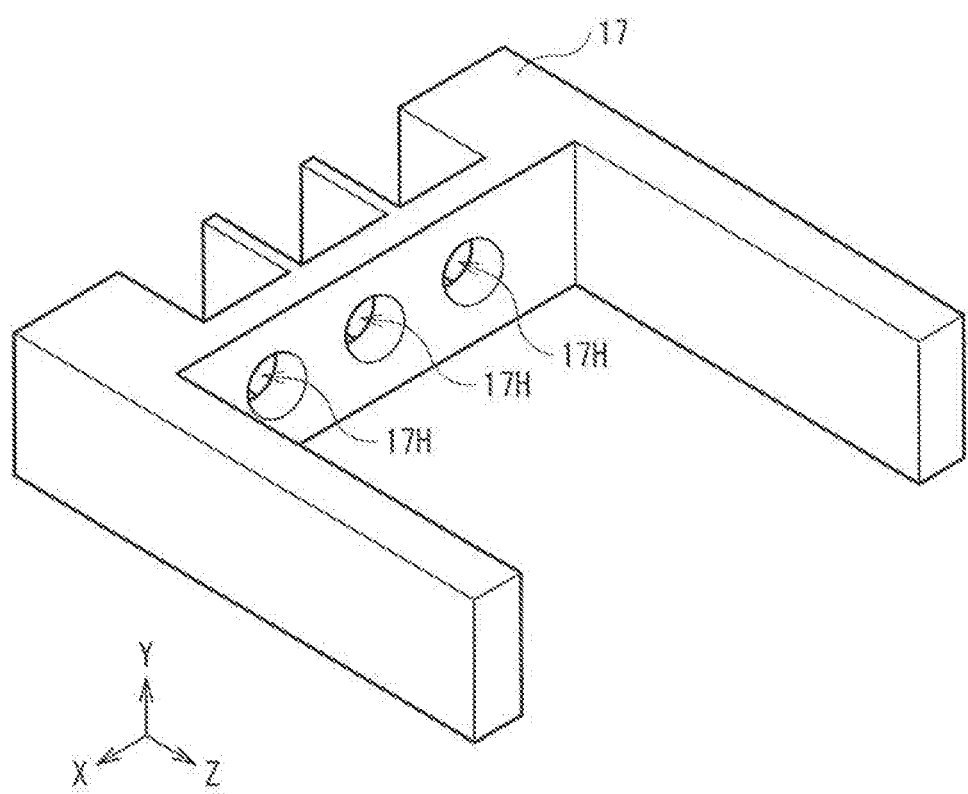

[FIG. 5A]
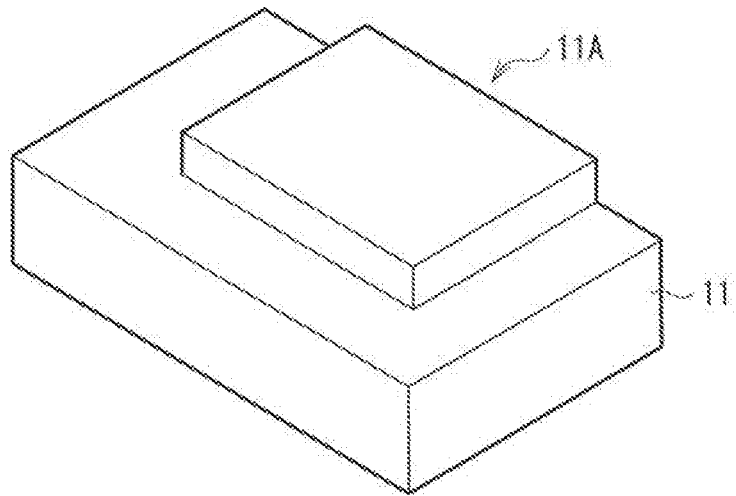
[FIG. 5B]
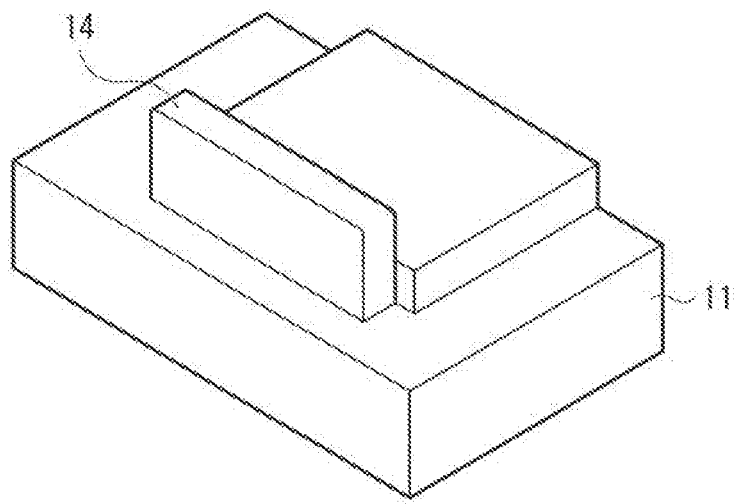
[FIG. 5C]
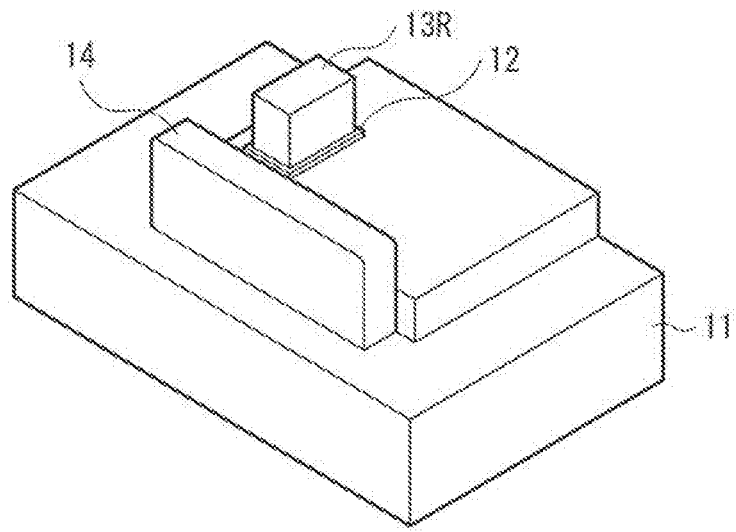

[ FIG. 6A ]
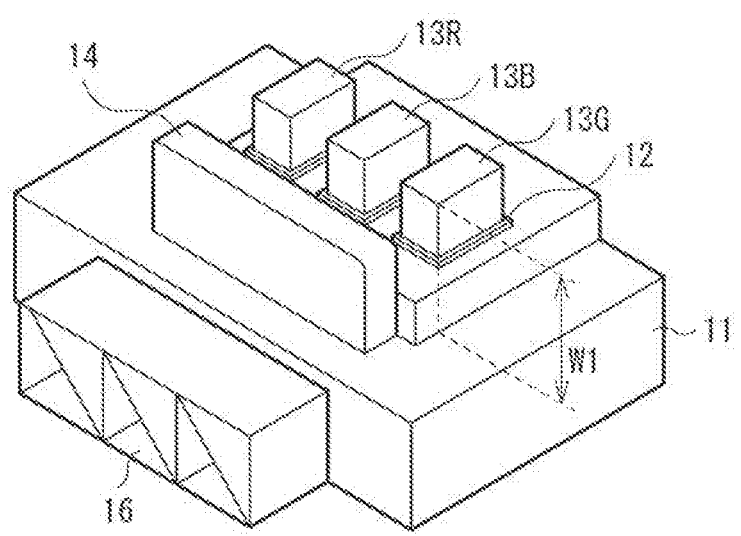
[ FIG. 6B ]
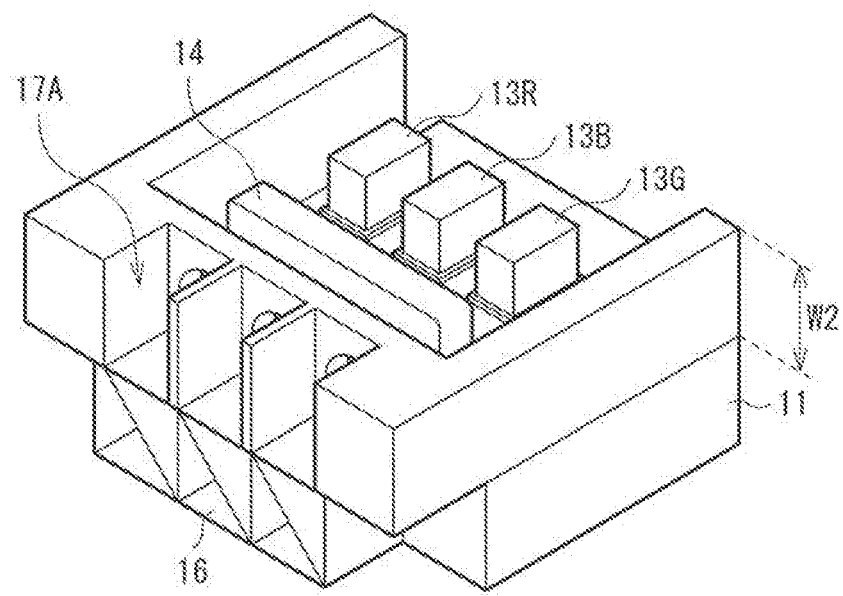

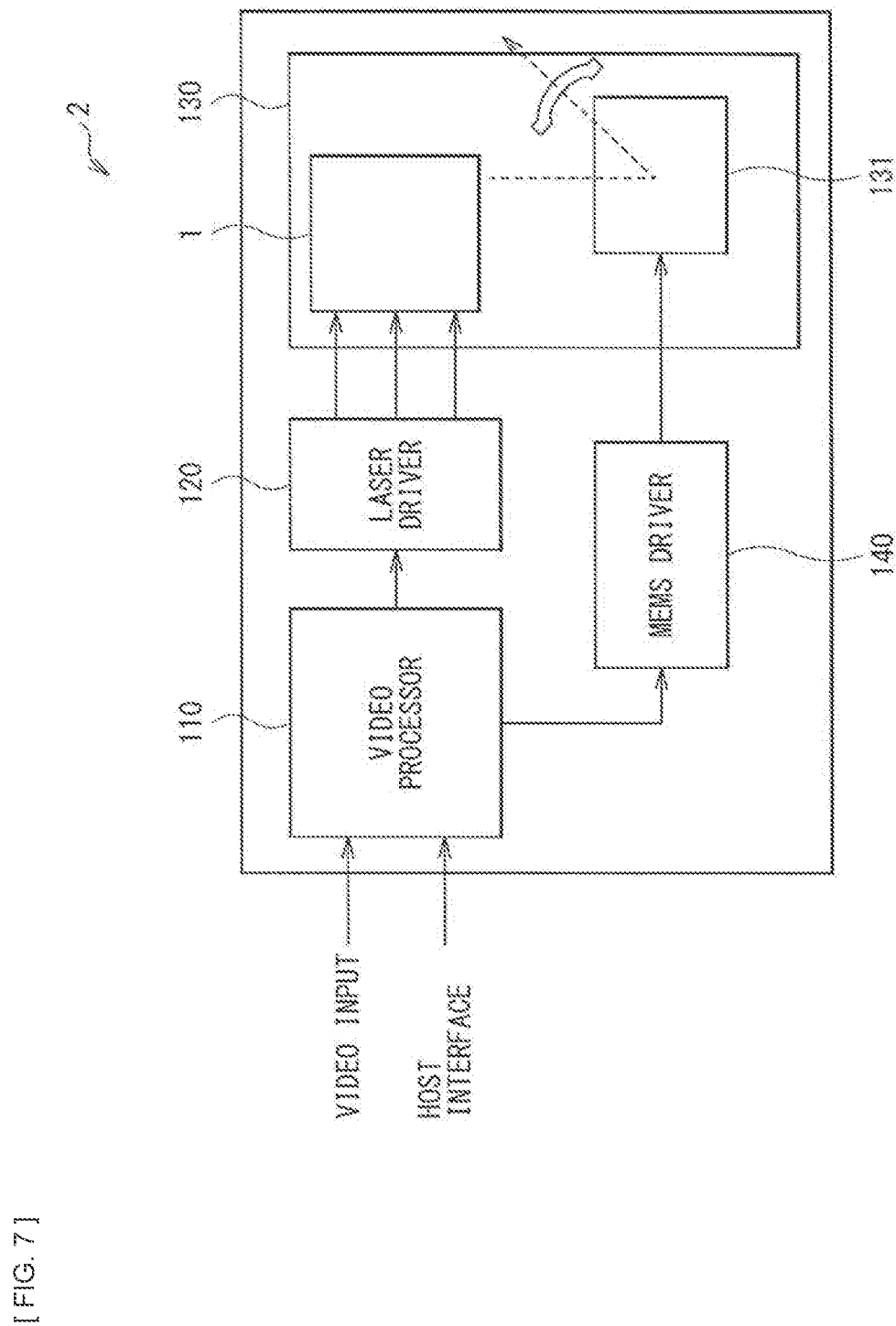
[FIG. 7]

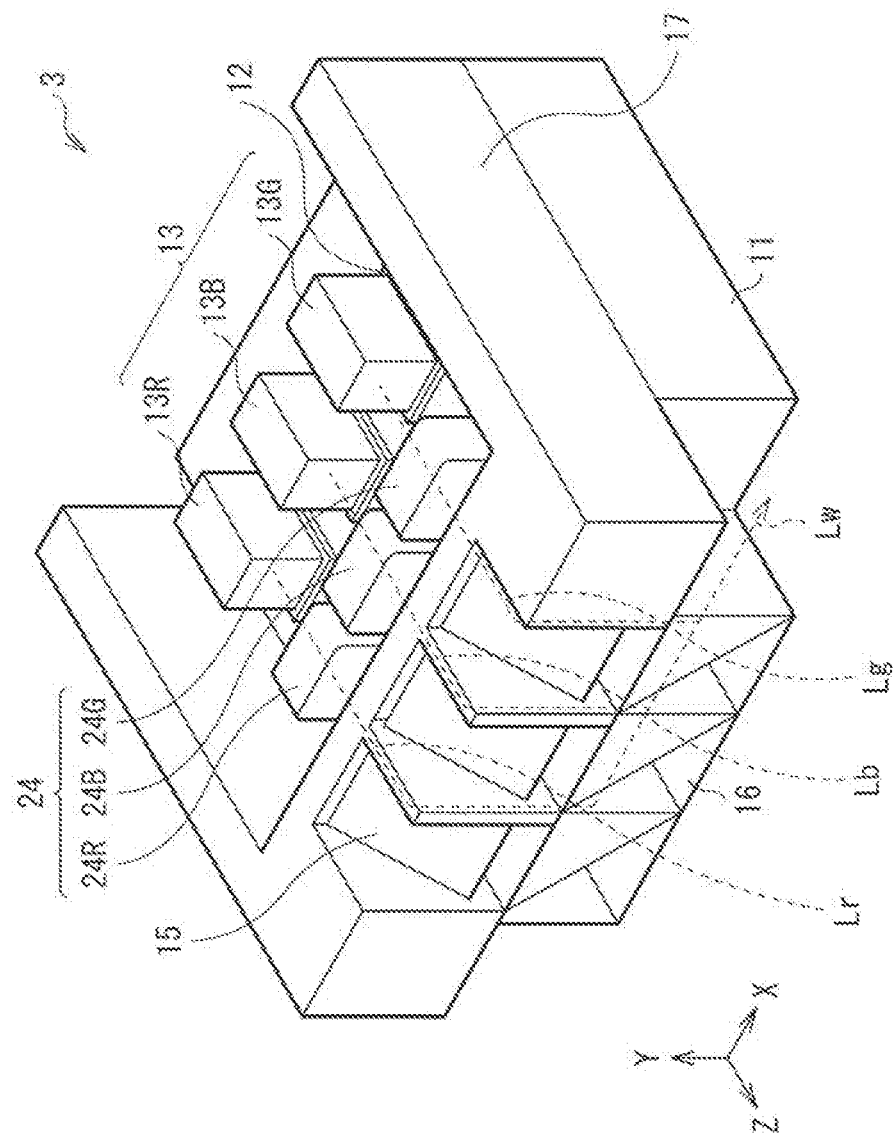
[FIG. 8]

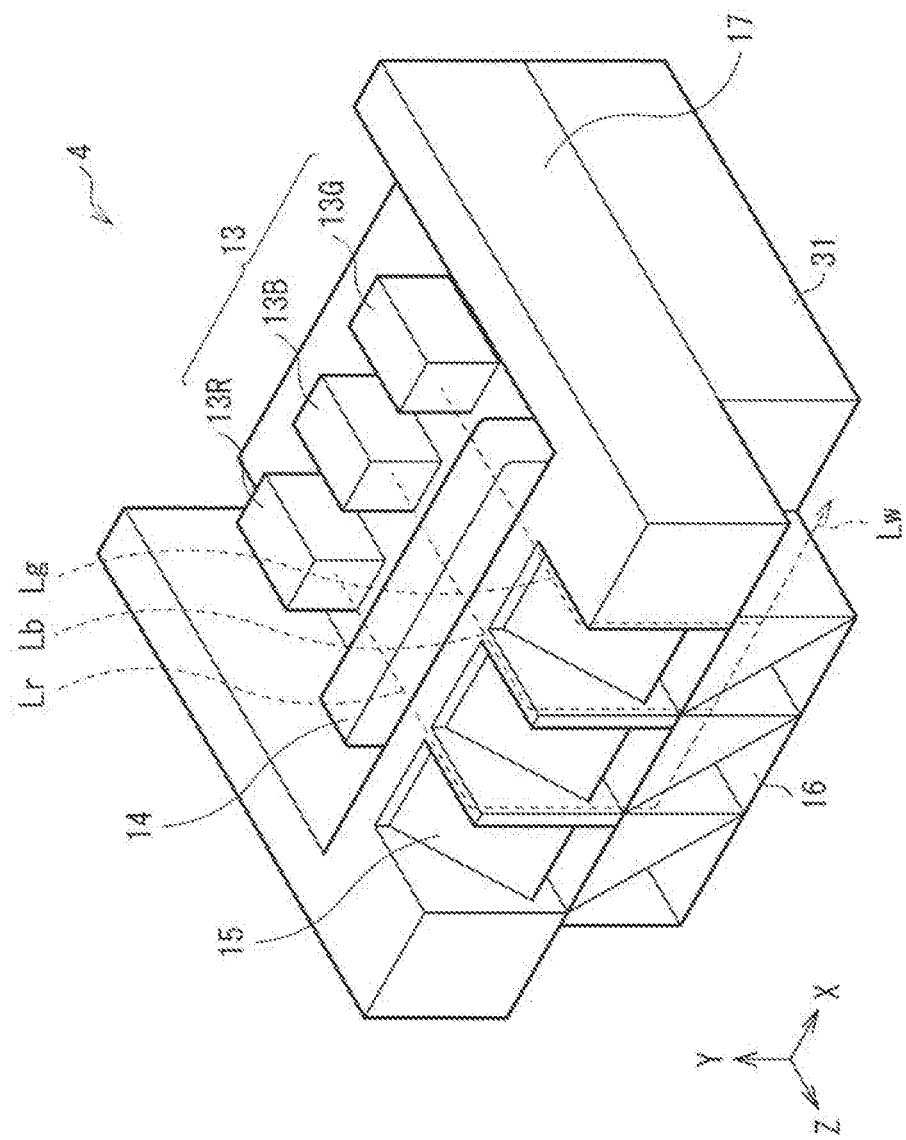
[FIG. 9]

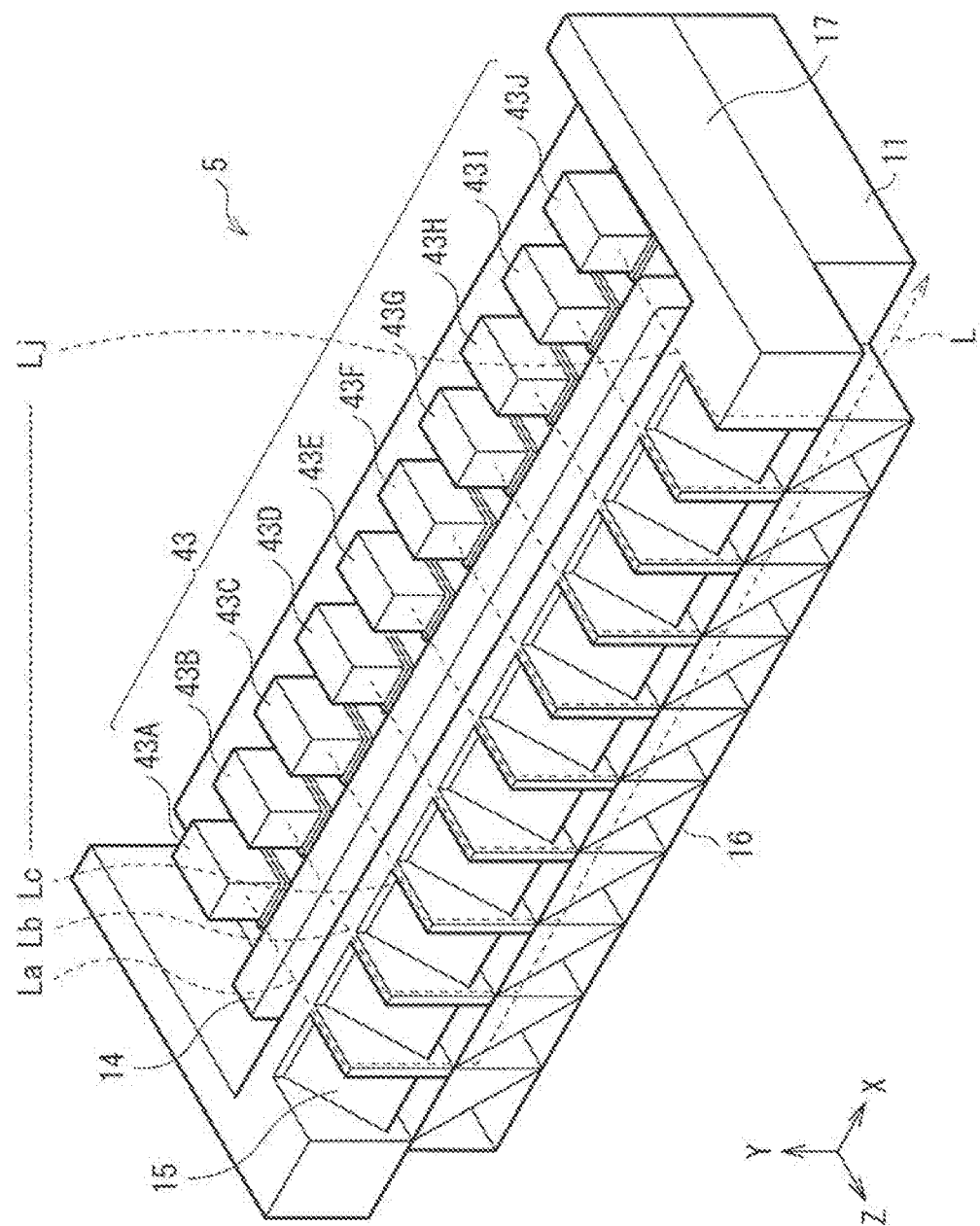
[FIG. 10]

[ FIG. 11 ]
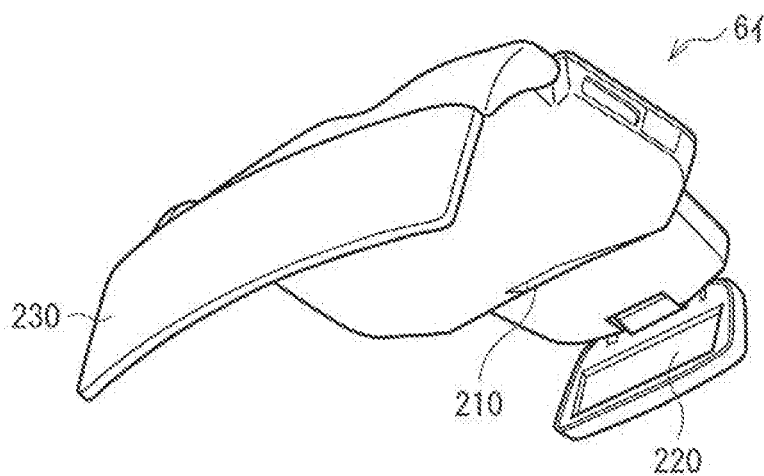
[ FIG. 12 ]
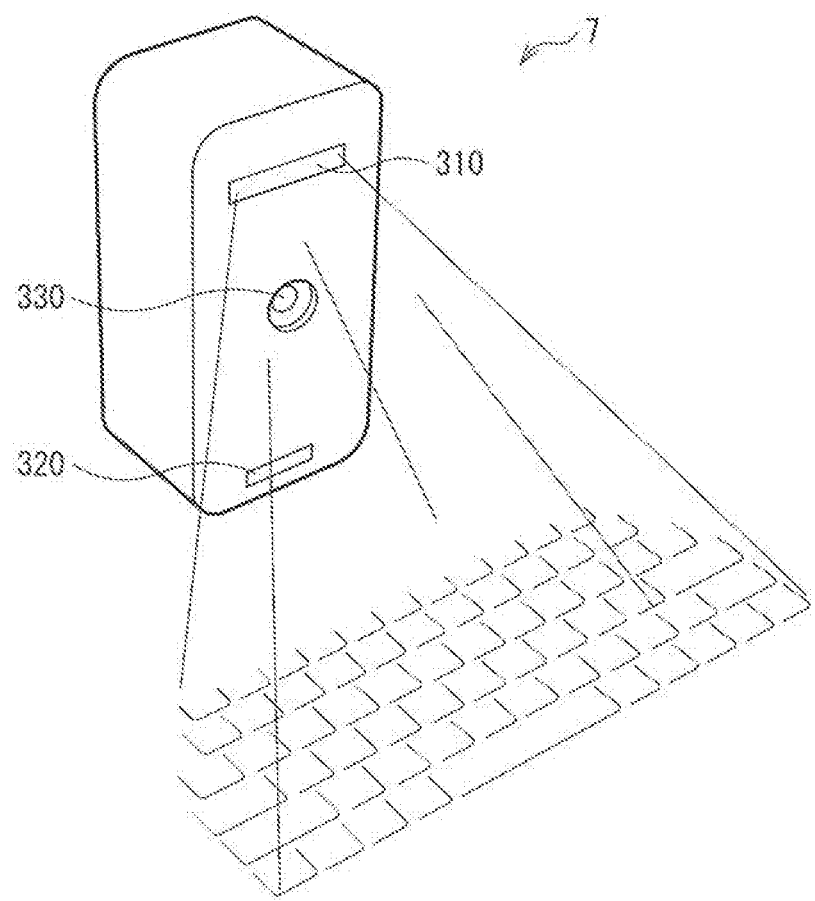

LIGHT SOURCE MODULE, METHOD OF MANUFACTURING LIGHT SOURCE MODULE, AND PROJECTION-TYPE DISPLAY UNIT

CROSS REFERENCE TO RELATED APPLICATIONS

This application is a U.S. National Phase of International Patent Application No. PCT/JP2017/022516 filed on Jun. 19, 2017, which claims priority benefit of Japanese Patent Application No. JP 2016-161143 filed in the Japan Patent Office on Aug. 19, 2016. Each of the above-referenced applications is hereby incorporated herein by reference in its entirety.

TECHNICAL FIELD

The present disclosure relates to a light source module that uses, for example, a semiconductor laser as a light-emitting element, a method of manufacturing the same, and a projection-type display unit that includes the same.

BACKGROUND ART

In recent years, RGB laser modules used for small projection-type display units such as a pico projector and a head up display have been developed. In an RGB laser module, for example, a semiconductor laser (Laser Diode: LD) of each of three primary colors (red, green, and blue) is mounted, and in general, a metal-can packaged LD is adopted for each of three primary color LDs. In such an RGB laser module, in adjustment of a light-emission point position, the light-emission point position in a horizontal direction is adjusted by means of an installation location of the LD, and the light-emission point position in a height direction is adjusted by means of a lens. After the adjustment of the light-emission point position is performed, the LD is fixed by a UV adhesive, a wet-type curing agent, etc. However, the UV adhesive and the wet-type curing agent each have thermal conductivity of a few degrees C./mK, which is low. For this reason, a decline in output of the LD during high temperature operation has been an issue.

To address this issue, for example, PTL 1 discloses a three-color light source in which a carrier is mounted on a temperature adjustment element, and LDs that output respective laser beams of red, green, and blue are mounted on the carrier. In this three-color light source, a temperature of each of the LDs is maintained constant, through controlling, with use of an ATC (Automatic Temperature Controller), a temperature of a TEC (temperature adjustment element) on which the carrier including the LDs are mounted.

CITATION LIST

Patent Literature

Japanese Unexamined Patent Application Publication No. 2016-15415

SUMMARY OF THE INVENTION

Incidentally, for small projection-type display units such as a pico projector and a head up display, a light source module that makes it possible to more easily adjust a light-emission point position is desired to achieve downsizing.

It is desirable to provide a light source module that makes it possible to more easily adjust a light-emission point position of a light beam outputted from each of a plurality of light-emitting elements, a method of manufacturing a light source module, and a projection-type display unit including the light source module.

A light source module according to an embodiment of the present disclosure includes: a radiator; a plurality of light-emitting elements disposed on the radiator; a plurality of lenses each of which converts a light beam outputted from corresponding one of the plurality of light-emitting elements into a collimated light beam and output the collimated light beam; a plurality of first optical elements that each reflect the collimated light beam outputted from corresponding one of the plurality of lenses while adjusting an optical axis direction of the collimated light beam; and a second optical element that multiplexes respective light beams reflected from the plurality of first optical elements.

A method of manufacturing a light source module according to an embodiment of the present disclosure includes: disposing a plurality of light-emitting elements on a radiator; disposing a plurality of lenses each of which converts a light beam outputted from corresponding one of the plurality of light-emitting elements into a collimated light beam and output the collimated light beam; disposing a plurality of first optical elements that each reflect the collimated light beam outputted from corresponding one of the plurality of lenses while adjusting an optical axis direction of the collimated light beam; and disposing a second optical element that multiplexes respective light beams reflected from the plurality of first optical elements.

A projection-type display unit according to an embodiment of the present disclosure includes the light source module according to the above-described embodiment, and a projection optical system that projects a light beam from the light source module.

In the light source module, the method of manufacturing the light source module, and the projection-type display unit according to the respective embodiments of the present disclosure, the plurality of first optical elements that each reflect the collimated light beam while adjusting the optical axis direction of the collimated light beam is disposed between the plurality of lenses each of which converts the light beam outputted from corresponding one of the plurality of light-emitting elements into the collimated light beam and output the collimated light beam, and the second optical element that multiplexes the light beams. This makes it possible to simplify an adjustment process for the optical axis direction of each of the light beams outputted from the plurality of light-emitting elements.

According to the light source module, the method of manufacturing the light source module, and the projection-type display unit of the respective embodiments of the present disclosure, the plurality of first optical elements that each reflect the light beam outputted from corresponding one of the plurality of light-emitting elements while adjusting the optical axis direction of the light beam is used; therefore, the adjustment process for the optical axis direction of each of the light beams is simplified. This makes it possible to more easily adjust a light-emission point position of the light beam outputted from each of the plurality of light-emitting elements.

It is to be noted that effects of the present disclosure are not necessarily limited to the effects described here, and may be any of effects described in the present disclosure.

BRIEF DESCRIPTION OF DRAWINGS

FIG. 1 is a perspective view of a configuration of a light source module according to an embodiment of the present disclosure.

FIG. 2 is a characteristic diagram illustrating a relationship between a change in environmental temperature and an optical-axis deviation amount due to expansion.

FIG. 3 is a schematic diagram for description of adjustment of an angle of a downward reflecting mirror.

FIG. 4 is a perspective view of a structure of a holding jig.

FIG. 5A is a perspective view for description of a process of manufacturing the light source module illustrated in FIG. 1.

FIG. 5B is a perspective view following FIG. 5A.

FIG. 5C is a perspective view following FIG. 5B.

FIG. 6A is a perspective view following FIG. 5C.

FIG. 6B is a perspective view following FIG. 6A.

FIG. 7 is a block diagram illustrating a configuration of a projection-type display unit (a pico projector) including the light source module illustrated in FIG. 1.

FIG. 8 is a perspective view of a configuration of a light source module according to a modification example 1 of the present disclosure.

FIG. 9 is a perspective view of a configuration of a light source module according to a modification example 2 of the present disclosure.

FIG. 10 is a perspective view of a configuration of a light source module according to a modification example 3 of the present disclosure.

FIG. 11 is a perspective view of an appearance of a head up display according to an application example 1.

FIG. 12 is a perspective view of an appearance of a projection-type keyboard according to an application example 2.

MODES FOR CARRYING OUT THE INVENTION

Some embodiments of the present disclosure are described below in detail with reference to the drawings. The embodiments described below each illustrate a specific example of the present disclosure, and the present disclosure is not limited to the following embodiments. Moreover, the present disclosure is not limited to positions, dimensions, dimension ratios, and other factors of respective components illustrated in the drawings. It is to be noted that description is given in the following order.

1. Embodiment (A pico projector provided with a light source module including a downward reflecting mirror)
   1-1. Configuration of Light Source Module
   1-2. Method of Manufacturing Light Source Module
   1-3. Configuration of Pico Projector
   1-4. Workings and Effects
2. Modification Examples
   2-1. Modification Example 1 (An example in which a collimated lens corresponding to each of semiconductor lasers is individually installed)
   2-2. Modification Example 2 (An example in which a semiconductor laser is directly implemented on a heatsink)
   2-3. Modification Example 3 (An example in which ten semiconductor lasers are implemented).
3. Application Examples

1. Embodiment

FIG. 1 schematically illustrates a configuration of a light source module (a light source module 1) according to an embodiment of the present disclosure. The light source module 1 is used, for example, for a small projection-type display unit such as a pico projector described later. The light source module 1 of the present embodiment includes two or more types of light-emitting elements (e.g., semiconductor lasers 13) that emit light beams of wavelengths different from one another, and various optical elements that multiplex light beams (e.g., laser beams) outputted from the plurality of semiconductor lasers 13, while adjusting an optical axis of each of the light beams.

(1-1. Configuration of Light Source Module)

The light source module 1 includes, as described above, the two or more types of semiconductor lasers 13 that emit light beams of wavelengths different from one another, and the various optical elements. In the present embodiment, the light source module 1 includes, for example, a semiconductor laser 13R that outputs a red light beam (a laser beam Lr), a green semiconductor laser 13G that outputs a green light beam (a laser beam Lg), and a blue semiconductor laser 13B that outputs a blue light beam (a laser beam Lb), as the semiconductor lasers 13. Each of the semiconductor lasers 13 (13R, 13G, and 13B) is, for example, implemented on a heatsink 11 with a sub-mount 12 interposed therebetween. Examples of the various optical elements include a collimated lens 14 (a lens), a downward reflecting mirror 15 (a first optical element), and a dichroic prism 16 (a second optical element). These optical elements are optically coupled to the red semiconductor laser 13R, the green semiconductor laser 13G, and the blue semiconductor laser 13B.

It is preferable that the heatsink 11 have high heat dissipation, and it is preferable that the heatsink 11 include, for example, a material having thermal conductivity of about 150 W/m·K. Further, it is preferable that the heatsink 11 have a small thermal expansion difference from each of other members (the sub-mount 12, the collimated lens 14, the dichroic prism 16, and a holding jig 17) that configure the light source module 1. Specifically, it is preferable that a deviation amount of an optical axis due to expansion of each member upon a temperature change (e.g., $\Delta=30°$ C.) in an driving environment be, for example, 0.5 μm or less.

FIG. 2 illustrates a relationship between a change in environmental temperature (° C.) and an optical-axis deviation amount (μm) due to expansion, in a thermal expansion coefficient difference between the heatsink 11 and any other member (e.g., the collimated lens 14), where a thermal expansion coefficient of the heatsink 11 is 4 ppm/K. It is to be noted that a calculation is made assuming that a distance to each expansion member is 2 mm. In general, for example, in a case where an optical-axis deviation amount is shifted by 0.5 μm, an optical-axis deviation amount on a screen (1.5 m) through a lens (a focal length f=1.5 mm) is 0.5 mm. In contrast, it can be seen from FIG. 2 that in a case where a thermal expansion coefficient difference between the heatsink 11 and the collimated lens 14 is 10 ppm/K or less, the optical-axis deviation amount due to expansion of each member upon a temperature change (e.g., $\Delta=30°$ C.) in the driving environment is 0.5 μm or less. Accordingly, it is preferable to select a material of each member so that the thermal expansion coefficient difference between the heatsink 11 and any other member (the sub-mount 12, the collimated lens 14, the dichroic prism 16, and the holding jig 17) is, for example, in a range from 0 ppm/K to 10 ppm/K both inclusive. In one example, a thermal expansion coefficient of the collimated lens 14 is, for example, from 5 ppm/K to 10 ppm/K. It is therefore preferable that the thermal expansion coefficient of the heatsink 11 also be a value close thereto. Examples of such material include silicon carbide (SiC), aluminum (Al), copper (Cu), etc.

In the present embodiment, the heatsink 11 has a substantially rectangular parallelepiped shape, and includes a base 11A (see FIG. 4A) on one surface (a first surface; a top surface). This base 11A is smaller than the top surface of the heatsink 11, and, for example, the semiconductor laser 13 is installed on the base 11A. A side surface of the base 11A is, for example, an installation position of the collimated lens 14 described later. The collimated lens 14 is disposed in contact with the side surface of the base 11A, and the base 11A thereby serves as a supporting member of the collimated lens 14. The holding jig 17 described later is installed around the base 11A to cover a front surface (e.g., a surface on light output surface side of the semiconductor laser 13) and side surfaces of the base 11A. The dichroic prism 16 is bonded to another surface (a second surface; a side surface) being in contact with this one surface (the top surface) of the heatsink 11.

The sub-mount 12 includes an insulating material. Specific examples of the insulating material include aluminum nitride (AlN), silicon carbide (SiC), etc. For example, a metallic thin film including titanium (Ti), platinum (Pt), gold (Au), or the like is formed on a front surface and a back surface of the sub-mount 12, and the sub-mount 12 is bonded to each of the heatsink 11 and the semiconductor laser 13 with solder interposed therebetween. As the solder, it is possible to use, for example, gold-tin (AuSn) solder, tin-silver (SnAg) solder, etc. It is to be noted that, in the present embodiment, the sub-mount 12 is individually provided for each of the red semiconductor laser 13R, the green semiconductor laser 13G, and the blue semiconductor laser 13B, but this is not limitative. For example, each of the semiconductor lasers 13R, 13G, and 13B may be installed on the one sub-mount 12.

The red semiconductor laser 13R includes a laser diode (LD) that outputs the laser beam Lr having a peak wavelength of a red color (e.g., from 630 nm to 650 nm). The red semiconductor laser 13R includes, for example, a GaAs-based material. Here, the GaAs-based material refers to a semiconductor material lattice-matching with GaAs, and examples thereof include GaAs, AlGaInP, etc. The red semiconductor laser 13R is installed on the top surface (specifically, on the base 11A) of the heatsink 11, for example, with the sub-mount 12 interposed therebetween. For example, electrodes (Au-Pads (not illustrated)) for a positive electrode and a negative electrode are installed on the sub-mount 12, and one electrode pad is electrically coupled to one polarity electrode of the red semiconductor laser 13R by means of, for example, AnSn. The other electrode pad is electrically coupled to the other polarity electrode on the sub-mount by, for example, wire bonding.

It is to be noted that the electrodes for the positive electrode and the negative electrode are not limited to the Au-Pads, and may include, for example, any other metal-electrode film such as Al. Further, the coupling between the electrode pad and the polarity electrode of the red semiconductor laser 13R may not be the AnSn coupling, and may be Ag paste coupling, coupling using In solder, or the like. Furthermore, the electrodes for the positive electrode and the negative electrode on the sub-mount 12 are electrically coupled to external electrodes using an external probe, etc., which makes it possible to perform implementation while actively recognizing a light-emission point position. After the implementation, the electrodes are coupled to the external electrodes by wire bonding, etc., and driven by a laser driver, etc.

The green semiconductor laser 13G includes an LD that outputs the laser beam Lg having a peak wavelength of a green color (e.g., from 500 nm to 550 nm). The green semiconductor laser 13G includes, for example, a GaN-based material. The green semiconductor laser 13G is installed on the top surface of the heatsink 11 with the sub-mount 12 interposed therebetween, as with the red semiconductor laser 13R. One polarity of the green semiconductor laser 13G is electrically coupled to the sub-mount 12, and the other polarity is electrically coupled to a region insulated from the one polarity, by wire bonding.

The blue semiconductor laser 13B includes an LD that outputs the laser beam Lb having a peak wavelength of a blue color (e.g., from 430 nm to 470 nm). The blue semiconductor laser 13B includes, for example, a GaN-based material. The blue semiconductor laser 13B is installed on the top surface of the heatsink 11 with the sub-mount 12 interposed therebetween, as with the red semiconductor laser 13R and the green semiconductor laser 13G. One polarity of the green semiconductor laser 13G is electrically coupled to the sub-mount 12, and the other polarity is electrically coupled to a region insulated from the one polarity, by wire bonding.

It is to be noted that FIG. 1 illustrates a state in which each of the red semiconductor laser 13R, the green semiconductor laser 13G, and the blue semiconductor laser 13B is covered by a cap. This cap is provided to hold the semiconductor laser 13 and the sub-mount 12, and providing such a configuration makes it possible to perform active implementation of each of the semiconductor lasers 13R, 13G, and 13B.

The red semiconductor laser 13R, the green semiconductor laser 13G, and the blue semiconductor laser 13B are each disposed on the heatsink 11, for example, along an X-axis direction, and output the laser beams Lr, Lg, and Lb in directions parallel with one another (e.g., a Z-axis direction). It is to be noted that it is desirable to design the red semiconductor laser 13R, the green semiconductor laser 13G, and the blue semiconductor laser 13B to have a small loss of transmission/reflection in the dichroic prism 16. Specifically, it is preferable to arrange the red semiconductor laser 13R, the green semiconductor laser 13G, and the blue semiconductor laser 13B in wavelength order, and as illustrated in FIG. 1, it is preferable to install the red semiconductor laser 13R, the blue semiconductor laser 13B, and the green semiconductor laser 13G in this order or in reverse order (in order of the green semiconductor laser 13G, the blue semiconductor laser 13B, and the red semiconductor laser 13R). It is to be noted that an implementation form of the red semiconductor laser 13R, the green semiconductor laser 13G, and the blue semiconductor laser 13B may be junction-up implementation, or may be junction-down implementation.

Further, in the present embodiment, the laser diode (LD) is used as the light-emitting element, but this is not limitative, and, for example, a super luminescent diode (SLD) may be used. In a case where the SLD is used, as with the above-described semiconductor lasers 13R, 13G, and 13G, one polarity of the SLD is electrically coupled to the sub-mount 12 and the other polarity is electrically coupled to a region insulated from the one polarity by wire bonding. In addition, in the SLD, end-surface coating is provided on front side and rear side, and it is possible to design the SLD with any reflectance. In one example, the SLD is designed to have a reflectance of 10% or less on the front side, and a reflectance of 99% or more on the rear side. It is to be noted that it is possible to apply this end-surface coating to the LD as well.

Furthermore, in the present embodiment, the three types of semiconductor lasers 13 (13R, 13G, and 13B) that respectively output the red light beam, the green light beam, and the blue light beam are used as the plurality of light-emitting elements, but this is not limitative, and a light-emitting element that outputs a light beam of any other wavelength such as an ultraviolet wavelength or an infrared wavelength may be used. Alternatively, a plurality of light-emitting elements that output light beams of the same wavelength may be used.

The collimated lens 14 converts each of the laser beams Lr, Lg, and Lb outputted from the respective semiconductor lasers 13R, 13G, and 13B into a collimated light beam, and outputs the collimated light beam. The collimated lens 14 has a lens design that corresponds to the number of the light-emitting elements (the semiconductor lasers 13R, 13G, and 13B). In lenses corresponding to the red semiconductor laser 13R, the green semiconductor laser 13G, and the blue semiconductor laser 13B, centers of light emission points may all have the same height or may be provided at positions different from one another. This light-emission point position is determined by a design of each of the semiconductor laser 13 and the collimated lens 14. The collimated lens 14 of the present embodiment is, for example, configured as an array lens in which three lenses are integrated, and is installed, for example, along the side surface of the base 11A, as illustrated in FIG. 1. The collimated lens 14 is bonded to the heatsink 11 by, for example, a bonding agent such as a silver (Ag) paste and a UV adhesive.

The downward reflecting mirror 15 reflects, for example, in a direction (a Y-axis direction) perpendicular to the top surface of the heatsink 11, each of the laser beams Lr, Lg, and Lb, which has been outputted from each of the semiconductor lasers 13R, 13G, and 13B, converted into the collimated light beam by the collimated lens 14 and then outputted, and thereby causes the thus-reflected light beams to enter the dichroic prism 16. The downward reflecting mirror 15 is provided for each of the semiconductor lasers 13R, 13G, and 13B, and has a film design suitable for each of the wavelengths. For the downward reflecting mirror 15, a reflection coating film corresponding to all the wavelengths of RGB may be used, or a reflecting mirror suitable for each of the wavelengths may be used. Further, the downward reflecting mirror 15 may be a total reflection mirror, or may be a partial transmission mirror. In a case where the partial transmission mirror is used, a photodetector may be installed therebehind (on side opposite to light incident side). Installing the photodetector and thereby monitoring optical power allows for feedback control of the optical power. The photodetector may be independently installed for each of the semiconductor lasers 13R, 13G, and 13B, or may be of an integrated array type, as with the collimated lens 14 in the present embodiment.

The downward reflecting mirror 15 is held by the holding jig 17 installed on the heatsink 11, as illustrated in, for example, FIG. 1. In the present embodiment, this downward reflecting mirror 15 performs adjustment of the height direction (the Y-axis direction) of the laser beams Lr, Lg, and Lb respectively outputted from the semiconductor lasers 13R, 13G, and 13G FIG. 3 illustrates an optical path of, for example, the laser beam Lr outputted from the red semiconductor laser 13R, and a cross section of the downward reflecting mirror 15. In the present embodiment, adjusting an angle θ of the downward reflecting mirror 15 with respect to the laser beam (e.g., the laser beam Lr) makes it possible to easily adjust the height direction of the laser beam. It is desirable to adjust the height of each of the laser beams Lr, Lg, and Lb through, for example, turning the downward reflecting mirror 15 by θ in parallel with each of the laser beams Lr, Lg, and Lb. At this time, positioning may be performed through monitoring a beam spot of a laser beam Lw resulting from multiplexing by the dichroic prism 16, by means of a beam profiler, etc. After this adjustment, the downward reflecting mirror 15 is fixed to the holding jig 17, using, for example, an UV-curable resin.

It is to be noted that the adjustment of the height direction of the laser beams Lr, Lg, and Lb may be performed by means of only the angle θ of the downward reflecting mirror 15, but may be performed by means of, in addition to the angle θ, an installation position of the downward reflecting mirror 15 in the Y-axis direction and the Z-axis direction. However, in a case where the installation position of the downward reflecting mirror 15 is adjusted in the Y-axis direction, an upper portion of the downward reflecting mirror 15 may protrude from a top surface of the holding jig 17, and it is therefore preferable to perform adjustment in the Z-axis direction.

As described above, the dichroic prism 16 is bonded to the side surface of the heatsink 11, and the dichroic prism 16 multiplexes the laser beams Lr, Lg, and Lb each reflected by the downward reflecting mirror 15, and outputs a thus-multiplexed light beam (the laser beam Lw of white).

The dichroic prism 16 reflects a portion of each of the laser beams Lr, Lg, and Lb in one direction (e.g., the X-axis direction) and outputs the reflected portion, while allowing a remaining portion to pass therethrough. The dichroic prism 16 has, for example, a right-angled triangular shape having a slope face 16a, a bottom face 16b, and a side face 16c, for each of the laser beams Lr, Lg, and Lb. In other words, the dichroic prism 16 includes the slope face 16a slanting with respect to a direction in which an optical axis of the laser beam Lw extends. The dichroic prism 16 is bonded to the heatsink 11 by, for example, a bonding agent such as a silver (Ag) paste and a UV adhesive, as with the collimated lens 14.

The holding jig 17 is installed on the top surface of the heatsink 11 as described above, and includes a holding section 17X that holds the downward reflecting mirror, and a protruding section 17Y that supports the holding section 17X. The holding section 17X is provided with a plurality of hollows 17A where the downward reflecting mirrors corresponding to the respective semiconductor lasers 13R, 13G, and 13B are installed. The holding jig 17 has, as illustrated in FIG. 3, an opening 17H in an optical path of each of the laser beams Lr, Lg, ad Lb outputted from the red semiconductor laser 13R, the green semiconductor laser 13G, and the blue semiconductor laser 13B. The opening 17H has, for example, a circular or elliptical shape, and it is desirable that the shape be similar to a beam spot shape of the semiconductor laser 13. It is preferable that the opening 17H have a size equal to or slightly larger than the beam spot size of the semiconductor laser 13. For example, the size of the opening 17H in a case where the beam spot shape is φ 1.0 mm is φ 1.2 mm with a margin of about 0.1 mm at both ends.

It is preferable that the holding jig 17 have a height h2 (see FIG. 6B) higher than a height h1 (see FIG. 6A) from the top surface of the heatsink 11 to a top surface of the semiconductor laser 13. This makes it possible to protect the top surface of the semiconductor laser 13. Further, a length 1 of the protruding section 17Y is not particularly limited, but the protruding section 17Y preferably has the length 1 extending to cover a side surface of the semiconductor laser 13. This makes it possible to protect the side surface of the semiconductor laser 13. Specifically, it is preferable that, also from the viewpoint of stability of the holding jig 17, for example, a front end of the protruding section 17Y extend, for example, to be flush with a rear surface (a side surface opposite to a light output direction of the semiconductor laser 13) of the heatsink 11, as illustrated in FIG. 1.

It is preferable that, as described above, the holding jig 17 be configured using a material that achieves a small difference from the thermal expansion coefficient of the material of the heatsink 11, in consideration of a temperature change during driving. Examples of such a material include ceramic such as SiC, metal such as Al, alloys thereof, etc. The holding jig 17 is bonded to the heatsink 11 by, for example, a bonding agent such as a silver (Ag) paste and a UV adhesive.

(1-2. Method of Manufacturing Light Source Module)

Next, a method of manufacturing the light source module 1 of the present embodiment is described using perspective views illustrated in FIGS. 5A, 5B, 5C, 6A, and 6B.

First, as illustrated in FIG. 5A, the heatsink 11 having a substantially rectangular parallelepiped shape and including the base 11A on the one side (the top surface) is prepared. Subsequently, as illustrated in FIG. 5B, the collimated lens 14 is disposed, for example, along the side surface of the base 11A, and fixed onto the heatsink 11 with use of, for example, an Ag paste as a bonding agent. It is preferable that a method of fixing the collimated lens 14 have heat resistance equal to or higher than that of a method of fixing the semiconductor laser 13 to be next performed, which is to prevent changing of a fixing position of the collimated lens 14 in fixing the semiconductor laser 13.

It is to be noted that it is preferable to use a material having high thermal conductivity for the bonding agent, from the viewpoint of heat dissipation. In addition, it is preferable to fix the semiconductor laser 13 and the collimated lens 14 with use of the same bonding agent, which is to reduce a member expansion difference of an adhesive caused in a case where a temperature difference occurs between a time period in a driving environment and a time period in an implementation environment. Reducing the expansion difference makes it possible to suppress a change in beam quality, such as a change in beam spot position due to a temperature difference.

Next, as illustrated in FIG. 5C, the respective semiconductor lasers 13 (13R, 13G, and 13B) are subjected to active implementation one by one. First, the semiconductor laser 13 (e.g., the red semiconductor laser 13R) implemented on the sub-mount 12 beforehand is prepared. Subsequently, for example, an Ag paste is applied onto the base 11A as a bonding agent. Next, the semiconductor laser 13R is energized by a probe to emit light (to oscillate), and an installation position of the semiconductor laser 13R is adjusted while the laser beam Lr passing through the collimated lens 14 is observed by a beam profiler, etc. Specifically, for example, adjustment is made so that a focal position of the collimated lens 14 and a light emission point of the laser beam Lr are coincident with each other. After the adjustment, the red semiconductor laser 13R is fixed. Each of the green semiconductor laser 13G and the blue semiconductor laser 13B is also implemented on the heatsink 11 by a similar method.

It is to be noted that it is desirable to bond the collimated lens 14 to the heatsink 11 before the implementation of the semiconductor laser 13; however, from the viewpoint of an implementation flow, the collimated lens 14 may be fixed onto the heatsink 11 once, and then fixed again after being removed upon the adjustment of the semiconductor laser 13.

Next, as illustrated in FIG. 6A, the dichroic prism 16 is fixed. It is to be noted that, for the bonding agent of the dichroic prism 16, a high heat radiation material is not necessarily used, because the dichroic prism 16 itself generates no heat. Subsequently, as illustrated in FIG. 6B, the holding jig 17 is installed on and fixed to the heatsink 11.

Lastly, the downward reflecting mirror 15 is fixed at a position of the hollow 17A of the holding jig 17. First, the semiconductor lasers 13R, 13G, and 13B are caused to emit light (to oscillate) to output the laser beams Lr, Lg, and Lb, respectively. Subsequently, adjustment of the angle θ of the downward reflecting mirror 15 for each of the semiconductor lasers 13R, 13G, and 13B is performed while observing a beam profile of the laser beam Lw resulting from multiplexing by the dichroic prism 16 after reflection by the downward reflecting mirror 15. After the adjustment, each of the downward reflecting mirrors 15 is fixed to the holding jig 17, with use of, for example, an UV-curable resin. The light source module 1 illustrated in FIG. 1 is thereby completed.

(1-3. Configuration of Pico Projector)

FIG. 7 is a block diagram illustrating a main configuration example of a projection-type display unit (a pico projector 2) including the light source module 1 in the present embodiment. The pico projector 2 is a small projector that makes it possible, in combination with a wireless LAN component, a battery, etc., to project an image on a smartphone, a tablet, etc. onto a flat surface or a curved surface such as a wall and a desk in a focus-free manner.

The pico projector 2 includes, for example, a video processor 110, a laser driver 120, an optical engine 130 including the light source module 1 that includes a laser output section and various optical elements, and a MEMS (Micro Electro Mechanical Systems) mirror 131, and a MEMS driver 140.

The video processor 110 holds an image supplied from a controller (not illustrated) and performs necessary image processing for the image. The video processor 110 supplies, to the laser driver 120 and the MEMS driver 140, an image to be projected.

The laser driver 120 controls the light source module 1 to project the image supplied from the video processor 110.

The light source module 1 includes, for example, each of the semiconductor lasers 13R, 13G, and 13B as the laser output section, and multiplexes laser beams of colors such as red, green, and blue outputted from these semiconductor lasers 13R, 13G, and 13B, through the various optical elements (e.g., the collimated lens 14, the downward reflecting mirror 15, and the dichroic prism 16) to guide the thus-multiplexed laser beam to the MEMS mirror 131, as described above.

The MEMS driver 140 is provided to control driving of a mirror of the MEMS mirror 131 to project the image supplied from the video processor 110. The MEMS mirror 131 scans the laser beam of each color through driving the mirror (the mirror) attached on an MEMS, in accordance with control by the MEMS driver 140. This laser beam is outputted from a projection outlet to outside of the unit, and is applied to a screen (not illustrated). The image supplied from the video processor 110 is thereby projected onto the screen.

(1-4. Workings and Effects)

In recent years, various laser modules used for small projection-type display units such as a pico projector and a head up display have been developed. In an ordinary laser module, in adjustment of a light-emission point position, as described above, the light-emission point position in a horizontal direction is adjusted by means of an installation location of a metal-can packaged LD, and the light-emission point position in a height direction is adjusted by means of a lens. After the adjustment of the light-emission point position is performed, the LD is fixed by a UV adhesive, a wet-type curing agent, etc. However, low thermal conductivity of the UV adhesive and the wet-type curing agent is a cause of a decline in output of the LD during high temperature operation.

As a method of addressing this issue, there is a method of directly implementing the LD on a substrate. As an example, there is a three-color light source in which a carrier is mounted on a temperature adjustment element, and LDs that output respective laser beams of red, green, and blue are mounted on the carrier. In this three-color light source, a temperature of each of the LDs is maintained constant, through controlling, with use of an ATC, a temperature of the temperature adjustment element on which the carrier including the LDs is mounted. However, in this method, a space for placement of a lens that performs conversion into a collimated light beam for each of the LDs is necessary. Further, three axes (X, Y, and Z directions) of the light-emission point position are adjusted by this lens, which causes an adjustment process to be considerably complicated.

In addition, there has been developed a wavelength laser unit in which an LD is implemented on each of a plurality of blocks, and each of the blocks is disposed on a stem to orient directions of laser beams outputted from the respective LDs to a predetermined same direction. In this wavelength laser unit, it is possible to make the light-emission point positions substantially the same, but there is a limit to bringing the light-emission point positions close, and it is difficult to use this wavelength laser unit as a light source module of a small projection-type display unit. Moreover, as downsizing proceeds, the block becomes small, and therefore a decrease in heat dissipation is conceivable.

Furthermore, an optical communication module that includes an array-type semiconductor laser, an array lens, and an array mirror has been developed. The array-type semiconductor laser is configured through integrating semiconductor lasers that output respective light beams of wavelengths different from one another, and the array lens converts each of the light beams outputted from the array-type semiconductor laser into a parallel light beam. The array mirror is configured through integrating a plurality of mirrors that each selectively reflect the light beam outputted from the array-type semiconductor laser. In this optical communication module, low-cost manufacturing and downsizing are possible, but there is a possibility that a light-emission point position may move upward and downward depending on quality of a wafer thickness of the semiconductor laser, and relative positions of the array lens and the light emission point are misaligned.

As described above, various laser modules have been developed; however, to implement a small projection-type display unit having higher definition and higher resolution, a light source module that makes it possible to adjust a light-emission point position more easily with higher accuracy is desired.

To adjust the light-emission point position on LD side, in particular, the light-emission point position in a height direction, adjustment of a wafer film thickness of each of the LDs is desired. Furthermore, giving consideration also to a film thickness of a sub-mount used in implementation of the LD is desired. There is a method of performing adjustment by means of a film thickness of an Ag paste, etc. that fixes the LD, but it is difficult to control a coating film thickness in the micron order. In addition, giving consideration also to a shrinkage amount in curing of a curable material such as an Ag paste is desired.

For example, in a pico projector in which a focal length of a lens is 1.5 mm and a screen is located 1.5 m from the lens, if a light-emission point position shifts by 1 µm, a beam spot shifts by 1 mm on a screen. This shift by 1 mm of the beam spot corresponds to a shift by one line in a laser-scan-type pico projector in which a beam spot diameter is 1 mm. In the pico projector, overlapping of at least a half of a beam spot is desirable, and specifically, a beam spot shift by 0.5 mm or less is desirable. For this reason, it is desirable that a shift amount of the beam spot be submicron or less, and, as described above, it is considerably difficult to adjust the height direction of the light-emission point position of the LD by the adjustment of the wafer film thickness of the LD, etc.

In contrast, in the present embodiment, the downward reflecting mirror 15 is installed between the collimated lens 14 and the dichroic prism 16, and the height direction (the Y-axis direction) of the laser beam is adjusted through adjusting the angle θ of this downward reflecting mirror 15 with respect to the laser beam (e.g., the laser beam Lr). It is to be noted that the adjustment of the horizontal direction (X and Z directions) is performed through adjusting the installation position of the semiconductor laser 13. This makes it possible to simplify the adjustment process for the optical axis direction of each of the laser beams Lr, Lg, and Lb that are outputted from the semiconductor lasers 13R, 13G, and 13B.

As described above, in the light source module 1 of the present embodiment, the above-described downward reflecting mirror 15 is installed between the collimated lens 14 and the dichroic prism 16. This makes it possible to adjust the height direction of each of the laser beams Lr, Lg, and Lb outputted from the semiconductor lasers 13R, 13G, and 13B through controlling the angle (the angle θ) of the downward reflecting mirror 15, and it is possible to adjust the light-emission point position of each of the laser beams Lr, Lg, and Lb easily.

Moreover, in the present embodiment, the thermal expansion coefficient difference between the heatsink 11 and other members, specifically, the sub-mount 12, the collimated lens 14, the dichroic prism 16, and the holding jig 17, is in a range from 0 ppm to 10 ppm both inclusive. This makes it possible to provide the light source module 1 less susceptible to a temperature change during operation.

Further, in the present embodiment, the array lens in which the lenses corresponding to the respective semiconductor lasers 13R, 13G, and 13B are integrated is used as the collimated lens 14. This makes it possible to reduce an edge portion of the collimated lens corresponding to each of the semiconductor lasers 13R, 13G, and 13B, and to downsize the light source module 1.

Furthermore, in the present embodiment, the opening 17H serving as an aperture is provided in the holding jig 17 that fixes the downward reflecting mirror 15. This makes it possible to provide the light source module 1 having high beam quality.

Moreover, the top surface of the holding jig 17 installed on the heatsink 11 is higher than the top surface of the semiconductor laser 13, which makes it possible to prevent damage to the semiconductor laser 13 in assembly of the pico projector 2, etc. This makes it possible to provide a highly durable and reliable electronic apparatus.

2. Modification Examples

Next, modification examples (modification examples 1 to 3) of the foregoing embodiment are described. It is to be noted that components corresponding to those of the light source module 1 of the foregoing embodiment are denoted by the same reference numerals, and the descriptions thereof are omitted.

2-1. Modification Example 1

FIG. 8 schematically illustrates a configuration of a light source module (a light source module 3) according to a modification example (the modification example 1) of the foregoing embodiment. The light source module 3 is used for the above-described projection-type display unit such as the pico projector, as with the foregoing embodiment. The light source module 3 of the present modification example includes the semiconductor lasers 13R, 13G, and 13B that output the laser beam Lr of red, the laser beam Lg of green, and the laser beam Lb of blue, respectively, a collimated lens 24 corresponding to each of the semiconductor lasers 13R, 13G and, 13B, the downward reflecting mirror 15, and the dichroic prism 16. In the light source module of the present disclosure, the collimated lens 24 may be installed for each of the semiconductor lasers 13R, 13G, and 13B individually, as in this light source module 3.

2-2. Modification Example 2

FIG. 9 schematically illustrates a configuration of a light source module (a light source module 4) according to a modification example (the modification example 2) of the foregoing embodiment. The light source module 4 is used for the above-described projection-type display unit such as the pico projector, as with the foregoing embodiment. The light source module 4 of the present modification example includes the semiconductor lasers 13R, 13G, and 13B that output the laser beam Lr of red, the laser beam Lg of green, and the laser beam Lb of blue, respectively, the collimated lens 14 corresponding to each of the semiconductor lasers 13R, 13G and, 13B, the downward reflecting mirror 15, and the dichroic prism 16. This light source module 4 is different from the foregoing embodiment in that the semiconductor lasers 13R, 13G, and 13B are individually implemented directly on a heatsink 31.

In a case where the heatsink 31 includes a material having an insulation property, it is possible to implement each of the semiconductor lasers 13R, 13G, and 13B directly on the heatsink 31, as in the present modification example. Examples of the material having the insulation property include MN ceramic, SiN, alumina-based insulating ceramic having high heat dissipation, etc.

2-3. Modification Example 3

FIG. 10 schematically illustrates a configuration of a light source module (a light source module 5) according to a modification example (the modification example 3) of the foregoing embodiment. The light source module 5 is used for the above-described projection-type display unit such as the pico projector, as with the foregoing embodiment. In the light source module 5 of the present modification example, ten semiconductor lasers 43 (43A, 43B, 43C, 43D, 43E, 43F, 43G, 43H, 43I, and 43J) are implemented on the heatsink 11, as the light-emitting elements. The ten semiconductor lasers 43A to 43$j$ may be ten types of semiconductor lasers having peak wavelengths different from one another, or may be configured through combining a plurality of semiconductor lasers having the same peak wavelength.

As described above, in the light source module of the present disclosure, it is possible to mount any number of light-emitting elements. In addition, FIG. 10 illustrates an example in which the semiconductor lasers 43A to 43$j$ are disposed, for example, in a line along the X-axis direction, but this is not limitative, and the semiconductor lasers 43A to 43$j$ may be two-dimensionally disposed, or may be staggered in a frontward-rearward direction, for example.

3. Application Examples

The pico projector 2 including the light source module 1 (or any of the light source modules 3 to 5) of the present disclosure is applicable to, for example, a wearable display such as a head up display, a portable display that is carriable, or any of various kinds of electronic apparatuses each having a projection function such as a smartphone and a tablet as described above. As an example, a schematic configuration of each of a head up display 6 (FIG. 11) and a projection-type keyboard 7 (FIG. 12) are described.

FIG. 11 illustrates an appearance of the head up display. This head up display 6 directly projects information in user's field of view, which makes it possible to display navigation information, etc. without obstructing a front field of view through mounting the head up display 6 on, for example, a vehicle, etc. This head up display 6 includes, for example, a light output section 210, a screen section 220, and a concave half mirror 230.

The light output section 210 includes the pico projector 2 of the present disclosure, and projects navigation information, etc. to be displayed on the concave half mirror 230. The screen section 220 reflects information projected from the light output section 210 and displays the reflected information on the concave half mirror 230. The concave half mirror 230 displays navigation information, etc.

FIG. 12 illustrates an appearance of the projection-type keyboard 7. This projection-type keyboard 7 is a combination of a projector and a sensor, and includes, for example, a projection section 310, an infrared-ray projection section 320, and a reading section 330.

The projection section 310 includes the pico projector 2 of the present disclosure, and projects a keyboard image on a desk, etc. as illustrated in FIG. 12. The infrared-ray projection section 320 forms an invisible light plane to detect a position of a measurement target (e.g., a finger). The reading section 330 includes a photodetector, and detects an infrared ray reflected from the finger to read a pressed key or movement.

Although the present disclosure has been described by way of the embodiments and the modification examples (the modification examples 1 to 3), the present disclosure is not limited thereto, and may be modified in a variety of ways. For example, in the foregoing embodiment, the dichroic prism 16 is described as an example of the second optical element, but, for example, a polarization beam splitter may be used. Further, the foregoing embodiment has been described using a small type display unit such as the pico projector as the projection-type display unit including the light source module 1 of the present disclosure, but this is not limitative, and, for example, the foregoing embodiment is applicable to a home theater, etc. Moreover, the foregoing embodiment is applicable to a laser beam pointer, etc.

It is to be noted that the effects described herein are merely illustrative. The effects of the present disclosure are not limited to the effects described herein. The present disclosure may have an effect other than the effects described herein.

It is to be noted that the present disclosure may have the following configurations.

(1)
A light source module including:
a radiator;
a plurality of light-emitting elements disposed on the radiator;
a plurality of lenses each of which converts a light beam outputted from corresponding one of the plurality of light-emitting elements into a collimated light beam and output the collimated light beam;
a plurality of first optical elements that each reflect the collimated light beam outputted from corresponding one of the plurality of lenses while adjusting an optical axis direction of the collimated light beam; and
a second optical element that multiplexes respective light beams reflected from the plurality of first optical elements.

(2)
The light source module according to (1), in which a difference between a thermal expansion coefficient of the radiator and a thermal expansion coefficient of the lens is in a range from 0 ppm/K to 10 ppm/K both inclusive.

(3)
The light source module according to (1) or (2), in which
the radiator has one surface on which the plurality of light-emitting elements are installed, and
the collimated light beams outputted from the plurality of lenses are reflected by the first optical elements in a direction perpendicular to the one surface of the radiator.

(4)
The light source module according to any one of (1) to (3), in which the first optical elements are fixed by a holding jig.

(5)
The light source module according to (4), in which the holding jig has an opening in an optical path of each of the light beams outputted from the plurality of light-emitting elements.

(6)
The light source module according to (4) or (5), in which
the radiator has a rectangular parallelepiped shape including a first surface and a second surface in contact with the first surface,
the plurality of light-emitting elements, the plurality of lenses, and the holding jig that fixes the plurality of first optical elements are installed on the first surface, and
the second optical element is installed on the second surface.

(7)
The light source module according to any one of (4) to (6), in which the holding jig extends at least to a portion of a side surface with respect to a light output surface of the light-emitting element, and a top surface of the holding jig is higher than top surfaces of the plurality of light-emitting elements.

(8)
The light source module according to any one of (1) to (7), in which the plurality of light-emitting elements are each individually disposed on the radiator.

(9)
The light source module according to any one of (1) to (8), in which the plurality of light-emitting elements are each disposed on the radiator with a sub-mount interposed therebetween.

(10)
The light source module according to any one of (1) to (9), in which the plurality of lenses are integrated.

(11)
The light source module according to any one of (1) to (10), in which the plurality of light-emitting elements output light beams of wavelengths different from one another.

(12)
The light source module according to any one of (1) to (11), in which the plurality of light-emitting elements each include a semiconductor laser or a super luminescent diode.

(13)
The light source module according to any one of (1) to (12), in which the second optical element includes a dichroic prism.

(14)
The light source module according to any one of (1) to (13), in which the plurality of light sources are two-dimensionally disposed on the radiator.

(15)
A method of manufacturing a light source module, the method including:
a process of disposing a plurality of light-emitting elements on a radiator;
a process of disposing a plurality of lenses each of which converts a light beam outputted from corresponding one of the plurality of light-emitting elements into a collimated light beam and output the collimated light beam;
a process of disposing a plurality of first optical elements that each reflect the collimated light beam outputted from corresponding one of the plurality of lenses while adjusting an optical axis direction of the collimated light beam; and
a process of disposing a second optical element that multiplexes respective light beams reflected from the plurality of first optical elements.

(16)
The method of manufacturing the light source module according to (15), in which after the plurality of lenses are fixed on the radiator, active implementation of each of the plurality of light-emitting elements is performed.

(17)
The method of manufacturing the light source module according to (16), in which after the active implementation of each of the plurality of light-emitting elements is performed, the second optical element and a holding jig that fixes the plurality of first optical elements are fixed in this order.

(18)
The method of manufacturing the light source module according to (17), in which the plurality of first optical elements are adjusted while observing a beam profile of light beams outputted from the plurality of light-emitting elements and multiplexed through the plurality of lenses, the plurality of first optical elements, and the second optical element.

(19)
A projection-type display unit provided with a light source module and a projection optical system that projects a light beam from the light source module, the light source module including:
a radiator;
a plurality of light-emitting elements disposed on the radiator;
a plurality of lenses each of which converts a light beam outputted from corresponding one of the plurality of light-emitting elements into a collimated light beam and output the collimated light beam;

a plurality of first optical elements that each reflect the collimated light beam outputted from corresponding one of the plurality of lenses while adjusting an optical axis direction of the collimated light beam; and a second optical element that multiplexes respective light beams reflected from the plurality of first optical elements.

This application claims the benefit of Japanese Priority Patent Application JP2016-161143 filed with the Japan Patent Office on Aug. 19, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light source system, comprising:
a radiator;
a plurality of light-emitting elements on a first surface of the radiator, wherein each light-emitting element of the plurality of light-emitting elements is configured to output a light beam;
a plurality of lenses on the radiator, wherein each lens of the plurality of lenses is configured to:
convert the light beam, outputted from a corresponding light-emitting element of the plurality of light-emitting elements, into a collimated light beam; and
output the collimated light beam;
a plurality of first optical elements on the radiator, wherein each first optical element of the plurality of first optical elements is configured to:
reflect the collimated light beam, outputted from a corresponding lens of the plurality of lenses, in a direction perpendicular to the first surface of the radiator; and
adjust an optical axis direction of the collimated light beam; and
a second optical element on the radiator, wherein the second optical element is configured to:
multiplex the collimated light beam reflected from each of the first optical element of the plurality of first optical elements; and
output the multiplexed collimated light beam.

2. The light source system according to claim 1, wherein a difference between a thermal expansion coefficient of the radiator and a thermal expansion coefficient of the plurality of lenses is in a range from 0 ppm/K to 10 ppm/K.

3. The light source system according to claim 1, wherein the plurality of first optical elements is fixable to a holding jig.

4. The light source system according to claim 3, wherein the holding jig has an opening in an optical path of the light beam outputted from each light-emitting element of the plurality of light-emitting elements.

5. The light source system according to claim 3, wherein the radiator has a rectangular parallelepiped shape including the first surface, and a second surface in contact with the first surface,
the plurality of light-emitting elements, the plurality of lenses, and the holding jig on the first surface, and
the second optical element is on the second surface.

6. The light source system according to claim 3, wherein the holding jig extends, at least to a portion of a side surface of the radiator, with respect to a light output surface of a light-emitting element of the plurality of light-emitting elements, and the holding jig has a top surface higher than a top surface of each light-emitting element of the plurality of light-emitting elements.

7. The light source system according to claim 1, further comprising a sub-mount between each light-emitting element of the plurality of light-emitting elements.

8. The light source system according to claim 1, wherein the plurality of lenses corresponds to an integrated collimated lens.

9. The light source system according to claim 1, wherein
a first light-emitting element of the plurality of light-emitting elements is configured to output a first light beam,
a second light-emitting element of the plurality of light-emitting elements is configured to output a second light beam, and
the first light beam has a wavelength different from a wavelength of the second light beam.

10. The light source system according to claim 1, wherein each light-emitting element of the plurality of light-emitting elements comprises one of a semiconductor laser or a super luminescent diode.

11. The light source system according to claim 1, wherein the second optical element comprises a dichroic prism.

12. The light source system according to claim 1, wherein the plurality of light-emitting elements are two-dimensionally disposed on the radiator.

13. A method of manufacturing a light source module, the method comprising:
disposing a plurality of light-emitting elements on a surface of a radiator, wherein each light-emitting element of the plurality of light-emitting elements is configured to output a light beam;
disposing a plurality of lenses on the radiator, wherein each lens of the plurality of lenses is configured to:
convert the light beam, outputted from a corresponding light-emitting element of the plurality of light-emitting elements, into a collimated light beam; and
output the collimated light beam;
disposing a plurality of first optical elements on the radiator, wherein each first optical element of the plurality of first optical element is configured to:
reflect the collimated light beam, outputted from a corresponding lens of the plurality of lenses, in a direction perpendicular to the surface of the radiator; and
adjust an optical axis direction of the collimated light beam; and
disposing a second optical element on the radiator, wherein the second optical element is configured to:
multiplex the collimated light beam reflected from each of the first optical element of the plurality of first optical elements; and
output the multiplexed collimated light beam.

14. The method of manufacturing the light source module according to claim 13, further comprising executing active implementation of each light-emitting element of the plurality of light-emitting elements after the plurality of lenses is disposed on the radiator.

15. The method of manufacturing the light source module according to claim 14, further comprising disposing the second optical element and a holding jig on the radiator after the execution of the active implementation of the each light-emitting element of the plurality of light-emitting elements, wherein the plurality of first optical elements are fixable to the holding jig.

16. The method of manufacturing the light source module according to claim 15, further comprising adjusting the plurality of first optical elements based on a beam profile of the multiplexed collimated light beam.

17. A projection-type display device, comprising:
 a light source system that includes:
  a radiator;
  a plurality of light-emitting elements on a surface of the radiator;
 wherein each light-emitting element of the plurality of light-emitting elements is configured to output a light beam;
  a plurality of lenses on the radiator, wherein each lens of the plurality of lenses is configured to:
   convert the light beam, outputted from a corresponding light-emitting element of the plurality of light-emitting elements, into a collimated light beam; and
   output the collimated light beam;
  a plurality of first optical elements on the radiator, wherein each first optical element of the plurality of first optical elements is configured to:
   reflect the collimated light beam, outputted from a corresponding lens of the plurality of lenses, in a direction perpendicular to the surface of the radiator; and
   adjust an optical axis direction of the collimated light beam; and
  a second optical element on the radiator, wherein the second optical element is configured to:
   multiplex the collimated light beam reflected from each of the first optical element of the plurality of first optical elements; and
   output the multiplexed collimated light beam; and
 a projection optical system configured to project the multiplexed collimated light beam outputted from the light source system.

18. A light source system, comprising:
 a radiator;
 a plurality of light-emitting elements on the radiator, wherein each light-emitting element of the plurality of light-emitting elements is configured to output a light beam;
 a plurality of lenses on the radiator, wherein
  each lens of the plurality of lenses is configured to:
   convert the light beam, outputted from a corresponding light-emitting element of the plurality of light-emitting elements, into a collimated light beam; and
   output the collimated light beam, and
  a difference between a thermal expansion coefficient of the radiator and a thermal expansion coefficient of the plurality of lenses is in a range from 0 ppm/K to 10 ppm/K;
 a plurality of first optical elements on the radiator, wherein each first optical element of the plurality of first optical element is configured to:
  reflect the collimated light beam outputted from a corresponding lens of the plurality of lenses; and
  adjust an optical axis direction of the collimated light beam; and
 a second optical element on the radiator, wherein the second optical element is configured to:
  multiplex the collimated light beam reflected from each of the first optical element of the plurality of first optical elements; and
  output the multiplexed collimated light beam.

* * * * *